United States Patent
Kim et al.

(10) Patent No.: US 7,099,198 B2
(45) Date of Patent: *Aug. 29, 2006

(54) ROW DECODER IN FLASH MEMORY AND ERASE METHOD OF FLASH MEMORY CELL USING THE SAME

(75) Inventors: Ki Seog Kim, Kyungki-Do (KR); Keun Woo Lee, Kyungki-Do (KR); Sung Kee Park, Kyungki-Do (KR); Yoo Nam Jeon, Kyungki-Do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 139 days.

This patent is subject to a terminal disclaimer.

(21) Appl. No.: 10/968,687

(22) Filed: Oct. 19, 2004

(65) Prior Publication Data

US 2005/0052906 A1   Mar. 10, 2005

Related U.S. Application Data

(63) Continuation of application No. 10/614,229, filed on Jul. 7, 2003, now Pat. No. 6,819,597.

(30) Foreign Application Priority Data

Jul. 18, 2002 (KR) ............... 2002-42155

(51) Int. Cl.
    *G11C 16/06* (2006.01)

(52) U.S. Cl. .................. 365/185.23; 365/185.29; 365/185.33

(58) Field of Classification Search ........... 365/185.23, 365/185.29, 185.33, 230.06, 185.18
    See application file for complete search history.

(56) References Cited

U.S. PATENT DOCUMENTS

| | | |
|---|---|---|
| 5,875,129 A | 2/1999 | Atsumi et al. |
| 6,088,267 A * | 7/2000 | Atsumi et al. ......... 365/185.23 |
| 6,347,052 B1 * | 2/2002 | Akaogi et al. ......... 365/185.23 |
| 6,356,481 B1 | 3/2002 | Micheloni et al. |
| 6,418,051 B1 | 7/2002 | Manstretta et al. |
| 6,498,756 B1 | 12/2002 | Lee |
| 6,504,769 B1 | 1/2003 | Do et al. |
| 6,704,226 B1 | 3/2004 | Lee |
| 6,731,560 B1 | 5/2004 | Yoon et al. |

OTHER PUBLICATIONS

German Patent Office Search Report dated Sep. 10, 2004.

* cited by examiner

*Primary Examiner*—David Lam
(74) *Attorney, Agent, or Firm*—Marshall, Gerstein & Borun LLP

(57) ABSTRACT

A row decoder in a flash memory comprises a first switch to selectively couple a word line to a first voltage terminal, and a second switch to selectively couple the word line to a second voltage terminal. The row decoder also comprises a third switch to selectively couple the word line to a third voltage terminal.

21 Claims, 3 Drawing Sheets

ROW DECODER IN FLASH MEMORY AND ERASE METHOD OF FLASH MEMORY CELL USING THE SAME

CROSS-REFERENCE TO RELATED APPLCIATION

This application is a continuation application of U.S. patent application Ser. No. 10/614,229, filed on Jul. 7, 2003, now U.S. Pat. No. 6,819,597, entitled "ROW DECODER IN FLASH MEMORY AND ERASE METHOD OF FLASH MEMORY CELL USING THE SAME," which is hereby incorporated by reference herein in its entirety for all purposes.

BACKGROUND OF THE INVENTION

1. Field of the Invention

The present disclosure relates to a flash memory device and an erase method thereof, and more particularly, to a row decoder in a flash memory and an erase method of the flash memory cell using the same.

2. Background of the Related Art

As the degree of integration in the flash memory device is increased, it is required that the thickness of an insulating film having a structure on which an ONO insulating film being a dielectric film between a floating gate and a control gate, i.e., an oxide film, a silicon nitride film and an oxide film are sequentially stacked be reduced. Meanwhile, as more faster erase speed is required, it is also required that an application voltage during an erasing operation be more high.

FIG. 1 illustrates a structure of the flash memory cell.

Referring to FIG. 1, the flash memory cell includes a source region 104 formed in a semiconductor substrate 100, and a drain region 102 formed with a channel region (not shown) intervened between the source region 104 and the drain region 102. A floating gate 108 is formed over the channel region with a tunnel oxide film 106 intervened between them. Further, a control gate 112 is formed over the floating gate 108 with a dielectric film 110 intervened between them. An erasing operation of the flash memory cell is performed by discharging charges (electrons) from the floating gate 108 to the semiconductor substrate 100 by means of F-N (Fowler-Nordheim) tunneling. A common erase method includes applying a negative high voltage (for example, −8V) to the control gate 112 and applying an adequate voltage (for example, +8V) to the semiconductor substrate 100. At this time, the drain region 102 is kept to be high impedance or floated in order to maximize the effect of erasing. A strong electric field is formed between the control gate 112 and the semiconductor substrate 100 by the above method. Due to this, F-N tunneling is generated so that the charges (electrons) within the floating gate 108 are discharged toward the semiconductor substrate 100.

As described above, conventionally, during the erasing operation, the potential difference between the control gate 112 and the semiconductor substrate 100 or source/drain 104/102 becomes about 16V since −8V is applied to the control gate 112 and +8V is applied to the semiconductor substrate 100. This potential difference is distributed by the floating gate 108, so that the voltage applied between the control gate, 112 and the floating gate 108 proportional to the capacitance ratio of the device is about 8V. As the breakdown voltage of the dielectric film 110 between the two gates 112 and 108 becomes 14V, the insulating strength of the ONO insulating film 110 can sufficiently cope with the potential difference organized upon erasing.

As shown in FIG. 2, however, if the floating gate 108 is connected to a contact 1114 (see 'A' in FIG. 2), it represents a characteristic of a trans-conductance cell (low Gm Cell) in which current flowing with the voltage of the floating gate 108 and the voltage applied to the drain 102 became equipotential is very low. The yield loss of this cell is improved by a column that was prepared in advance upon designing, i.e., a repair scheme (see FIG. 3) replaced by a redundancy cell. However, as the voltage applied upon erasing is simultaneously applied to a failed cell and a repaired cell, the voltage applied between the control gate 112 and the floating gate 108 thus becomes about 15.5V, as shown in FIG. 2. This is more than the insulating strength of the ONO insulating film and a fail is thus caused during the cycling. In other words, upon erasing, the source 104 and the drain 102 are floated, −8V is applied to the control gate 112 and +8V is applied to the semiconductor substrate 100. At this time, as the semiconductor substrate 100 is a P type and the drain 102 is an N type, a forward bias is applied between the semiconductor substrate 100 and the drain 102, which serves as a P-N diode. Accordingly, the result is that a voltage of about 7.5V is applied to the drain 102 considering voltage drop of the P-N diode. Therefore, when the floating gate 108 is connected to the contact 114, as the voltage of the floating gate 108 and the voltage applied to the drain 102 are the same voltage, the floating gate 108 has a voltage of 7.5V. Also, the result is that a voltage of about 15.5V is applied to the dielectric film 110 between the floating gate 108 and the control gate 112. Due to the above, an insulating break phenomenon may happen.

SUMMARY OF THE INVENTION

In one aspect, a row decoder in a flash memory is provided. The row decoder comprises a first switch to selectively couple a word line to a first voltage terminal, and a second switch to selectively couple the word line to a second voltage terminal. The row decoder also comprises a third switch to selectively couple the word line to a third voltage terminal.

In another aspect, an erasing method in a flash memory device, the flash memory device including a row having a failed cell and a redundant row, is provided. The method comprises applying an erasing voltage to a word line of a redundant row during an erasing operation, and applying a non-erasing voltage to a word line of a row having a failed cell during the erasing operation.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
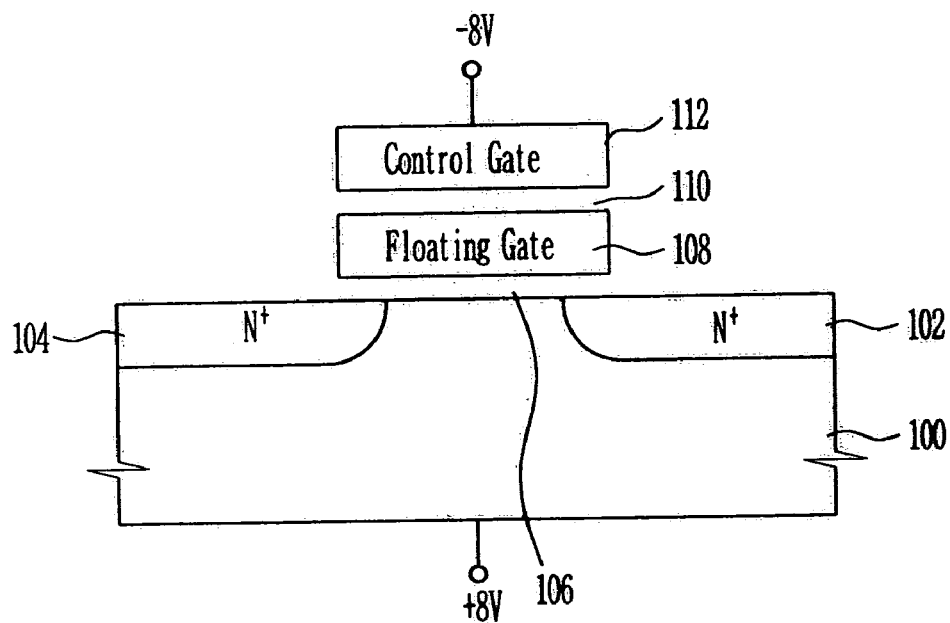
FIG. 1 illustrates a structure of the flash memory cell.
Figure 2:
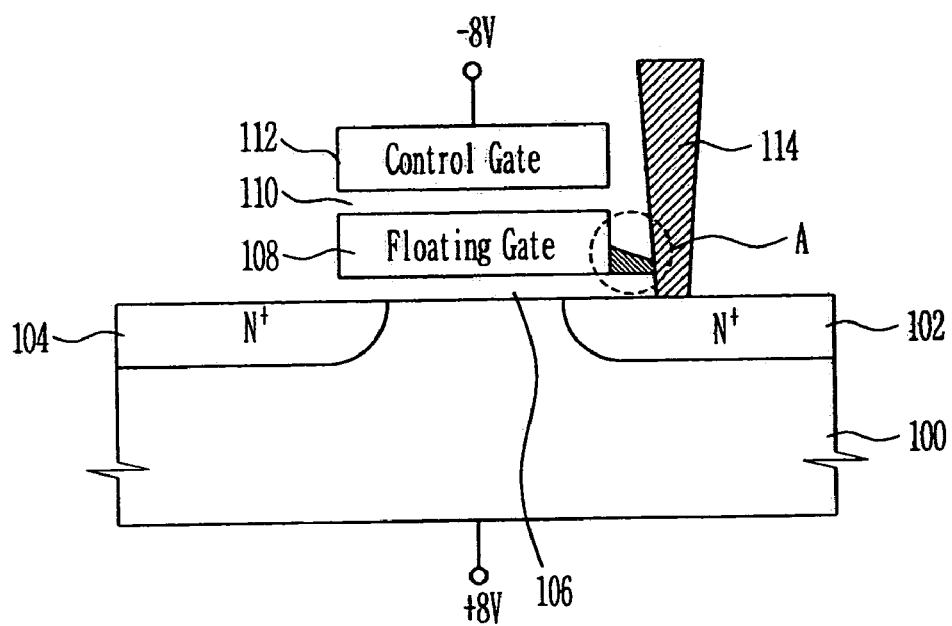
FIG. 2 illustrates a structure of the flash memory cell in which a fail bit is generated.
Figure 3:
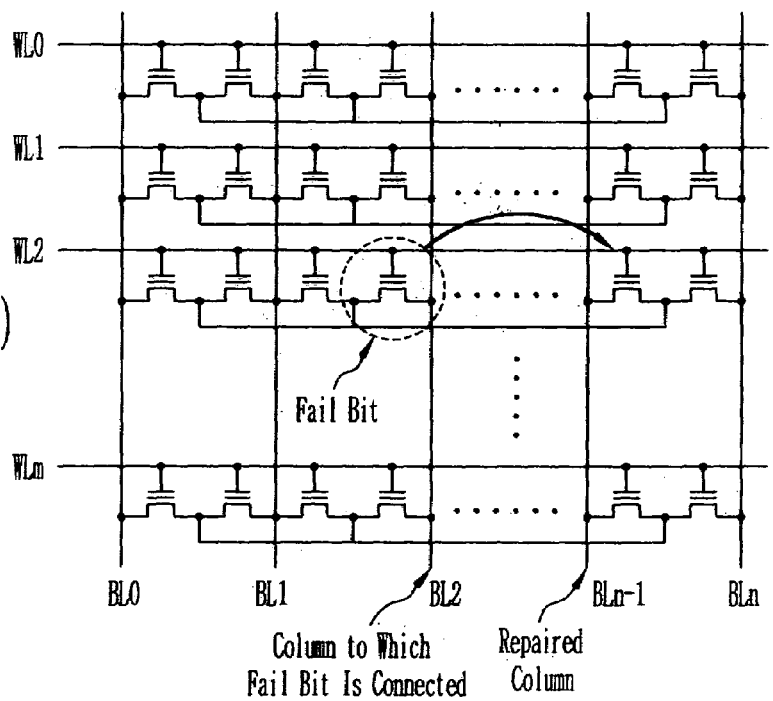
FIG. 3 illustrates a conventional flash memory cell for which column redundancy repair is performed.

Reference will now be made in detail to the preferred embodiments of the present invention, examples of which are illustrated in the accompanying drawings, in which like reference numerals are used to identify the same or similar parts.

In the present invention, the potential difference that gives stress to the ONO insulating film is the potential difference between the control gate and the floating gate upon erasing in the flash memory cell. Thus a method of keeping a voltage of the control gate sharing the fail bit that may cause break of the ONO insulating film 0V upon erase operation is utilized.

Figure 4:
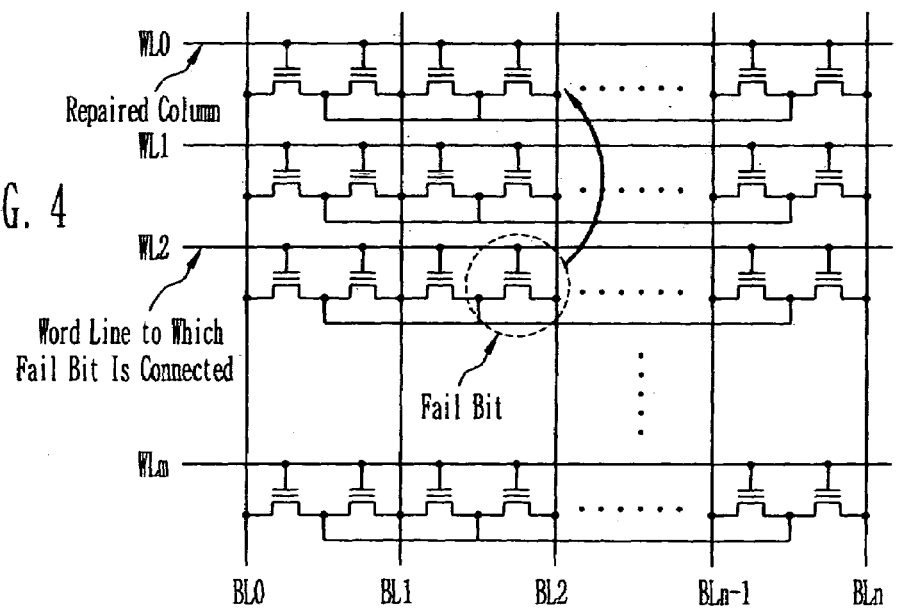
FIG. 4 is a circuit diagram of a flash memory device for which row redundancy repair is performed.

FIG. 4 is a circuit diagram of a flash memory device for which row redundancy repair is performed.

Referring now to FIG. 4, the present invention employs row redundancy without existing column redundancy in order to repair low trans-conductance 1 bit fail.

If there is a low Gm (trans-conductance) cell as in FIG. 4, row repair is performed without performing column repair. Thereafter, if an erase operation such as cycling, etc. is to be performed, the potential difference applied between the floating gate and the control gate in the cell in which the fail bit happens is made about 7.5V being a voltage that does not far reach the insulating break voltage of the ONO insulating film, by applying −8V to a word line in which a fail bit did not occur and 0V to a word line in which the fail bit occurred using the row decoder according to a preferred embodiment of the present invention. Therefore, it is possible to prohibit an insulating break phenomenon of the ONO insulating film, which may happen upon erasing such as cycling, etc.

The operation of the row decoder for applying −8V to a word line having no any fail bit and 0V to a word line to which a fail bit is connected, will be below described.

Figure 5:
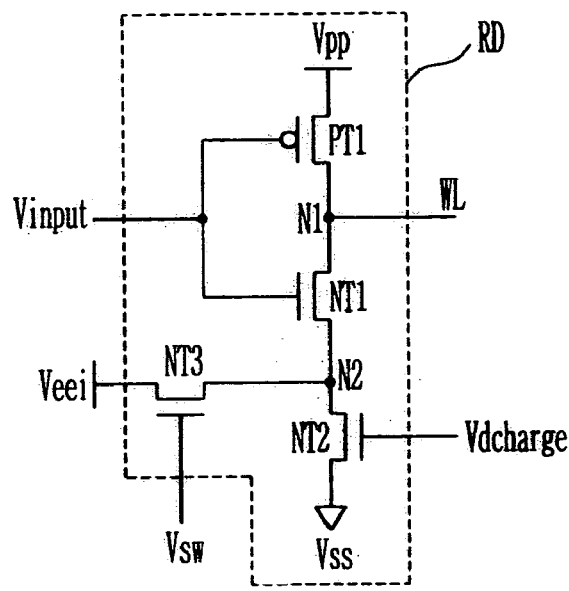
FIG. 5 is a circuit diagram of a row decoder according to a preferred embodiment of the present invention.

FIG. 5 is a circuit diagram of a row decoder according to a preferred embodiment of the present invention.

Referring to FIG. 5, the row decoder RD comprises three transistors including a PMOS transistor PT1, a first NMOS transistor NT1 and a second NMOS transistor NT2, and a switching means NT3 for controlling a negative voltage applied to a word line WL during the erasing operation. The output terminal of a row decoder RD is transferred to the word line WL. The PMOS transistor PT1 and the first NMOS transistor NT1 are serially connected between a first power supply terminal (Vpp) and a second node N2. Also, the PMOS transistor PT1 and the first NMOS transistor NT1 are driven by a first input signal (Vinput). In other words, the PMOS transistor PT1 is connected between the first power supply terminal (Vpp) and the first node N1. The first NMOS transistor NT1 is connected between the first node N1 and the second node N2. The PMOS transistor PT1 and the first NMOS transistor NT1 are commonly driven by the first input signal (Vinput). Further, the second NMOS transistor NT2 is connected between the second node N2 and the ground terminal Vss. The second NMOS transistor NT2 is driven by the second input signal (Vdcharge). A switching means NT3 is connected between the second node N2 and a second power supply terminal Veei. The switching means NT3 is driven by a third input signal (Vsw). The switching means NT3 may be an NMOS transistor.

The operation of the row decoder RD according to a preferred embodiment of the present invention will be below described.

If the first input signal (Vinput) is a High signal, the PMOS transistor PT1 is turned off and the first NMOS transistor NT1 is turned on. At this time, if the second input signal (Vdcharge) is the High signal, the second NMOS transistor NT2 is turned on. Due to this, the potential of the second node N2 becomes a ground voltage level, so that 0V being the voltage of the ground terminal Vss is outputted to the word line WL.

Further, if the first input signal (Vinput) is a High signal, the second input signal (Vdcharge) is a Low signal and the second NMOS transistor NT2 is thus turned off, and the switching means NT3 is turned on, the potential of the second node N2 thus becomes the level of the second power supply terminal Veei. A negative voltage is thus outputted from the second power supply terminal Veei to the word line. If the third input signal (Vsw) is a High signal when the switching means NT3 is an NMOS transistor, the switching means NT3 is turned on.

Meanwhile, in a program and read mode, a Low signal is applied to the first input signal (Vinput) to make the PMOS transistor PT1 turned on and make the first NMOS transistor NT1 turned off. A positive voltage of the first power supply terminal Vpp is thus outputted to the word line WL.

An erasing operation using the row decoder according to a preferred embodiment of the present invention will be below described in detail.

For the erasing operation such as cycling, etc., a voltage is applied to respective terminals, respectively, using the row decoder according to a preferred embodiment of the present invention.

TABLE 1

| | Word Line Having Fail Bit Connected Thereto | Word Line Having No Fail Bit |
|---|---|---|
| Vinput | Vcc | Vcc |
| Veei | −8 V | −8 V |
| Vsw | −8 V | Vcc |
| Vdcharge | Vcc | −8 V |

In the erasing mode, 0V being the ground voltage is applied to the word line WL to which the fail bit is connected. For this, the power supply voltage (Vcc) is applied as the first input signal (Vinput) and the second input signal (Vdcharge), and −8V is also applied as the third input signal (Vsw). At this time, as the PMOS transistor PT1 is turned off, the first NMOS transistor NT1 is turned on, the second NMOS transistor NT2 is turned on and the switching means NT3 is turned off, the potential of the second node N2 becomes the ground voltage level. 0V being the ground voltage is thus outputted to the word line WL. Meanwhile, a voltage of −8V is applied to the second power supply terminal Veei.

−8V being the voltage of the second power supply terminal Veei is applied to the word line WL where the fail bit did not occur. For this, the power supply voltage (Vcc) is applied as the first input signal (Vinput) and the third input signal (Vsw) and −8V is applied as the second input signal (Vdcharge). At this time, the PMOS transistor PT1 is turned off, the first NMOS transistor NT1 is turned on, the second NMOS transistor NT2 is turned off and the switching means NT3 is turned on. Accordingly, as the potential of the second node N2 becomes the voltage level of the second power supply terminal Veei, −8V being the voltage of the second power supply terminal Veei is outputted to the word line WL.

As such, as different voltages (−8V and 0V) are each applied to the word line having no fail bit and the word line to which the fail bit is connected using the row decoder of the present invention, the potential difference applied between the floating gate and the control gate become about 7.5V for both the cell in which the fail bit happened and the normal cell. Therefore, it is possible to prohibit an insulating break phenomenon of the ONO insulating film that may happen during the easing operation such as cycling, etc. In other words, in the prior art, −8V is supposed to be applied to all the word lines including the gate, to which the fail bits are connected. In the present invention, however, −8V is applied all the word lines having no fail bits but 0V is applied to the word lines to which the fail bits are connected.

Figure 6:
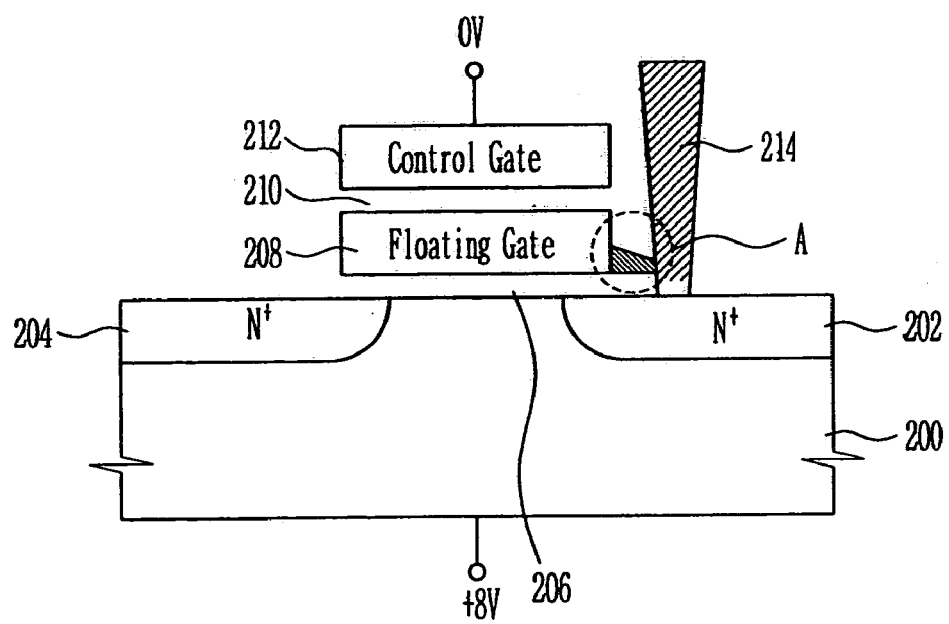
FIG. 6 illustrates a flash memory cell in which a fail bit occurred, to which the ground voltage is applied to the gate thereof using an erase method according to the present invention.

Therefore, as shown in FIG. 6, even though a floating gate 208 is connected to a contact 214 (see 'A' in FIG. 6), the potential difference applied between a floating gate 208 and a control gate 212 becomes about 7.5V, which far less amounts to the insulating break voltage of the ONO insulating film 210. Accordingly, it is possible to prevent the insulating break phenomenon of the ONO insulating film 210 that may happen during the erasing operation such as cycling, etc. and secure reliability of the flash memory device.

As described above, according to the present invention, different voltages (−8V and 0V) are each applied to the word line having no fail bit and the word line to which the fail bit is connected, using the row decoder of the present invention. Due to this, the potential difference applied between the floating gate and the control gate becomes a voltage that far less amounts to an insulating break voltage of an ONO insulating film for the cell in which the fail bit occurred and the normal cell. Therefore, the present invention has an advantageous effect that it can prevent an insulating break phenomenon of the ONO insulating film that may happen during an erasing operation such as cycling, etc.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed are:

1. A row decoder in a flash memory, comprising:
   a first switch to selectively couple a word line to a first voltage terminal;
   a second switch to selectively couple the word line to a second voltage terminal; and
   a third switch to selectively couple the word line to a third voltage terminal;
   wherein the first switch and the second switch are controlled by one or more first control signals;
   wherein the third switch is controlled by a second control signal.

2. A row decoder according to claim 1, wherein the first switch comprises a PMOS transistor coupled between the first voltage terminal and the word line.

3. A row decoder according to claim 1, wherein the second switch comprises a first NMOS transistor coupled between the second voltage terminal and the word line.

4. A row decoder according to claim 3, further comprising a fourth switch to selectively couple the first NMOS transistor to the word line.

5. A row decoder according to claim 4, wherein the fourth switch comprises a second NMOS transistor coupled between the first NMOS transistor and the word line.

6. A row decoder according to claim 1, wherein the third switch comprises a first NMOS transistor coupled between the third voltage terminal and the word line.

7. A row decoder according to claim 6, further comprising a fourth switch to selectively couple the first NMOS transistor to the word line.

8. A row decoder according to claim 7, wherein the fourth switch comprises a second NMOS transistor coupled between the first NMOS transistor and the word line.

9. A row decoder according to claim 1, wherein a voltage at the first voltage terminal comprises a positive voltage.

10. A row decoder according to claim 1, wherein a voltage at the second voltage terminal comprises a negative voltage.

11. A row decoder according to claim 1, wherein the one or more first control signals includes two first control signals to separately control the first switch and the second switch.

12. An erasing method in a flash memory device using a row decoder, the flash memory device including a row having a failed cell and a redundant row, comprising:
   applying an erasing voltage to a word line of the redundant row during an erasing operation; and
   applying a non-erasing voltage to a word line of the row having the failed cell during the erasing operation.

13. An erasing method according to claim 12, wherein applying the erasing voltage to the word line of the redundant row comprises coupling the word line of the redundant row to a first voltage terminal using a first switch, the first voltage terminal having the erasing voltage.

14. An erasing method according to claim 13, wherein coupling the word line of the redundant row to the first voltage terminal using the first switch comprises coupling the word line of the redundant row to the first voltage terminal using a MOS transistor.

15. An erasing method according to claim 13, further comprising decoupling the word line of the redundant row from a second voltage terminal using a second switch, the second voltage terminal having the non-erasing voltage.

16. An erasing method according to claim 12, wherein applying the erasing voltage to the word line of the redundant row comprises applying a negative voltage to the word line of the redundant row.

17. An erasing method according to claim 16, wherein applying the negative voltage to the word line of the redundant row comprises applying a voltage of about −8V to the word line of the redundant row.

18. An erasing method according to claim 12, wherein applying the non-erasing voltage to the word line of the row having the failed cell comprises coupling the word line of the row having the failed cell to a first voltage terminal using a first switch, the first voltage terminal having the non-erasing voltage.

19. An erasing method according to claim 18, wherein coupling the word line of the row having the failed cell to the first voltage terminal using the first switch comprises coupling the word line of the row having the failed cell to the first voltage terminal using a MOS transistor.

20. An erasing method according to claim 18, further comprising decoupling the word line of the row having the failed cell from a second voltage terminal using a second switch, the second voltage terminal having the erasing voltage.

21. An erasing method according to claim 12, wherein applying the non erasing voltage to the word line of the row having the failed cell comprises applying a ground voltage to the word line of the row having the failed cell.

* * * * *